(12) United States Patent
Scott

(10) Patent No.: US 11,765,848 B2
(45) Date of Patent: Sep. 19, 2023

(54) HOST ELECTRONIC DEVICE HAVING A MOVABLE COOLING COMPONENT FOR REMOVABLE ELECTRONIC DEVICE

(71) Applicant: HEWLETT PACKARD ENTERPRISE DEVELOPMENT LP, Houston, TX (US)

(72) Inventor: Michael Scott, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 57 days.

(21) Appl. No.: 17/388,412

(22) Filed: Jul. 29, 2021

(65) Prior Publication Data
US 2023/0034486 A1 Feb. 2, 2023

(51) Int. Cl.
*H05K 7/14* (2006.01)
*H05K 7/20* (2006.01)

(52) U.S. Cl.
CPC ....... *H05K 7/1402* (2013.01); *H05K 7/20436* (2013.01); *H05K 7/205* (2013.01); *H05K 7/20154* (2013.01); *H05K 7/20509* (2013.01)

(58) Field of Classification Search
CPC ............. H05K 7/20772; H05K 7/1487; H05K 7/20509; H05K 7/1452; H05K 7/20718; G11B 33/122
See application file for complete search history.

(56) References Cited

U.S. PATENT DOCUMENTS

| | | | |
|---|---|---|---|
| 4,825,337 A * | 4/1989 | Karpman | H05K 7/20545 174/16.3 |
| 6,829,142 B2 | 12/2004 | Belady et al. | |
| 7,090,519 B2 * | 8/2006 | Muramatsu | H01R 13/6335 439/159 |
| 7,212,409 B1 | 5/2007 | Belady et | |
| 7,448,921 B2 * | 11/2008 | Kim | H05K 5/0286 439/744 |
| 7,667,972 B2 * | 2/2010 | Chen | H05K 7/2049 165/185 |

(Continued)

OTHER PUBLICATIONS

Havis Inc., "Swing Arm With Motion Device Adapter," Part # C-MD-132, published Aug. 17, 2021, https//www.havis.com/products/ACTADP_HDM_TS_SP-126620-882.html.

*Primary Examiner* — Michael A Matey
(74) *Attorney, Agent, or Firm* — Hewlett Packard Enterprise Patent Department

(57) ABSTRACT

Example implementations relate to a host electronic device configured for establishing a thermal contact between a heat generating component of a removable electronic device, and a cooling component of the host electronic device, when the removable electronic device is detachably connected to the host electronic device. The host electronic device includes a support structure, the cooling component, a driver, and an actuator. The cooling component is movably connected to the support structure. The driver is also movably connected to the support structure. The actuator is movably connected to the support structure and the driver. The actuator, upon contact by the removable device, causes a movement of the cooling component via the driver for establishing the thermal contact between the cooling component and the heat generating component.

18 Claims, 9 Drawing Sheets

(56) References Cited

U.S. PATENT DOCUMENTS

| | | | | |
|---|---|---|---|---|
| 8,879,267 | B2* | 11/2014 | Henry | H04L 12/6418 |
| | | | | 361/709 |
| 8,911,244 | B2* | 12/2014 | Elison | H05K 7/20409 |
| | | | | 439/137 |
| 8,923,013 | B2 | 12/2014 | Anderson et al. | |
| 9,453,972 | B1* | 9/2016 | Arvelo | G02B 6/3825 |
| 10,111,365 | B1* | 10/2018 | Junkins | G11B 33/1426 |
| 10,212,852 | B1* | 2/2019 | Reddy | F28F 3/022 |
| 10,222,844 | B1* | 3/2019 | Reddy | G06F 1/183 |
| 10,310,198 | B1* | 6/2019 | Yatskov | G02B 6/4261 |
| 10,321,607 | B2* | 6/2019 | Ito | G02B 6/42 |
| 10,925,186 | B2* | 2/2021 | Selvidge | H05K 7/20509 |
| 11,202,391 | B2* | 12/2021 | Chien | H05K 7/2049 |
| 11,300,363 | B2* | 4/2022 | Gupta | F28F 3/02 |
| 11,481,009 | B1* | 10/2022 | Scott | H05K 7/20263 |
| 2004/0226689 | A1* | 11/2004 | Thompson | F28F 3/06 |
| | | | | 165/905 |
| 2005/0162834 | A1* | 7/2005 | Nishimura | H05K 7/20509 |
| | | | | 361/710 |
| 2005/0220425 | A1* | 10/2005 | Kropp | G02B 6/4292 |
| | | | | 385/88 |
| 2007/0274046 | A1* | 11/2007 | Choi | H05K 5/0295 |
| | | | | 361/702 |
| 2009/0296350 | A1* | 12/2009 | Oki | G02B 6/4269 |
| | | | | 361/709 |
| 2010/0067196 | A1* | 3/2010 | Costello | H05K 7/20509 |
| | | | | 361/709 |
| 2017/0027083 | A1* | 1/2017 | Bai | H05K 7/20672 |
| 2018/0123268 | A1* | 5/2018 | Leigh | H01R 13/62933 |
| 2019/0335611 | A1* | 10/2019 | Chang | G06F 1/183 |
| 2020/0260615 | A1* | 8/2020 | Leigh | G06F 1/20 |
| 2021/0109574 | A1 | 4/2021 | Franz et al. | |
| 2021/0127529 | A1 | 4/2021 | Hanna et al. | |
| 2022/0052474 | A1* | 2/2022 | Chiu | G02B 6/4261 |
| 2022/0057849 | A1* | 2/2022 | Chang | G06F 1/187 |

\* cited by examiner

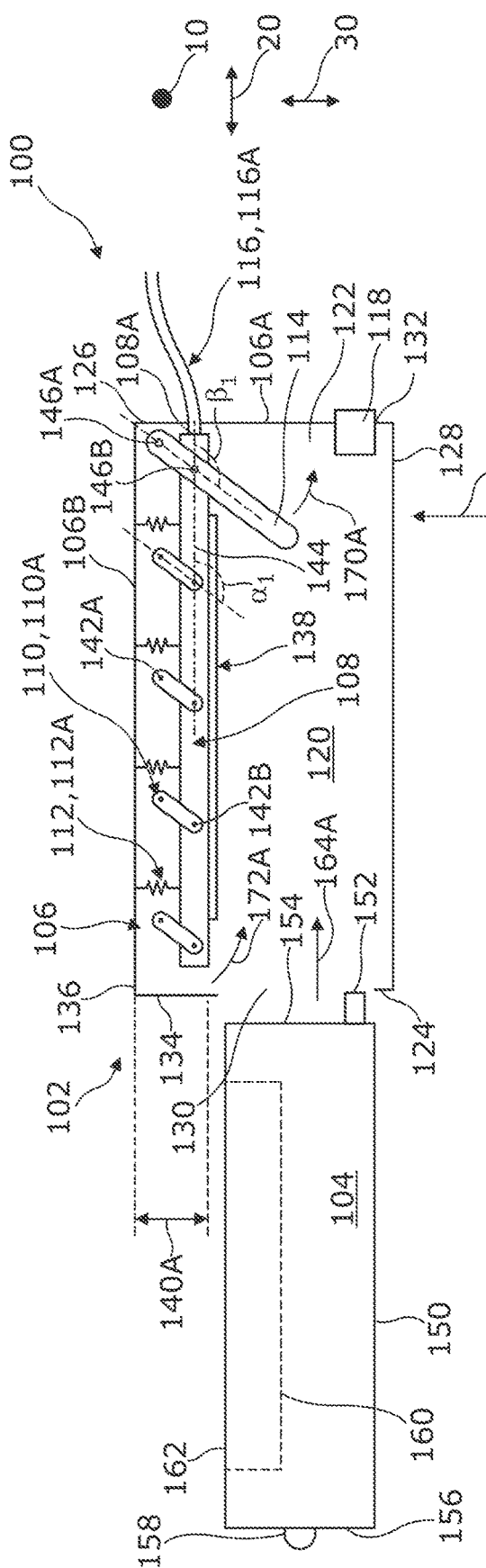
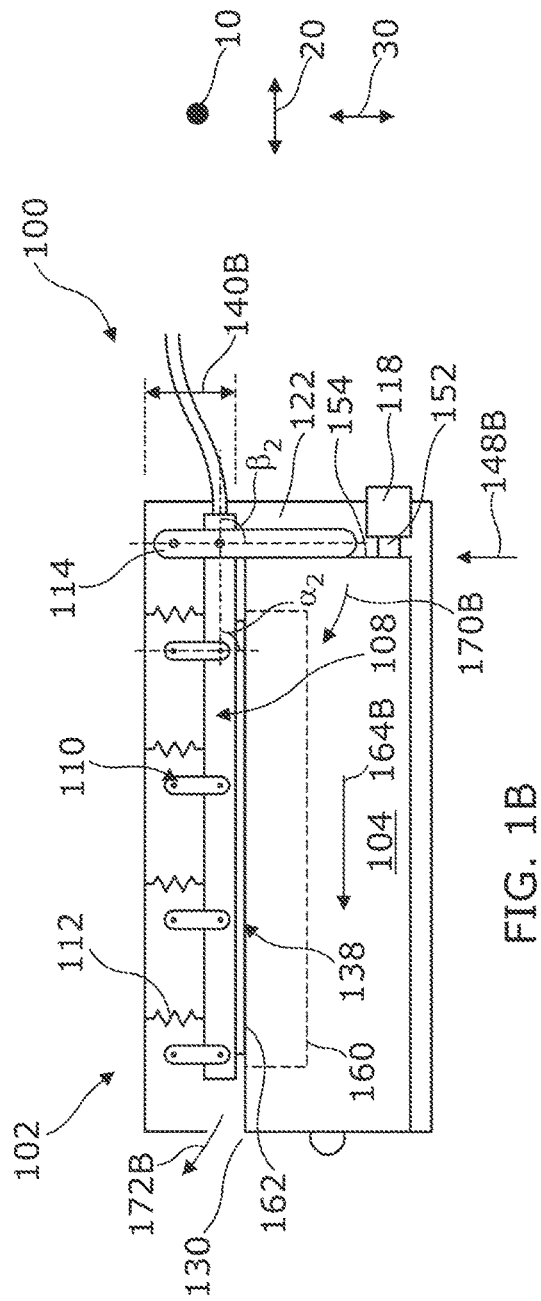
FIG. 1A
FIG. 1B

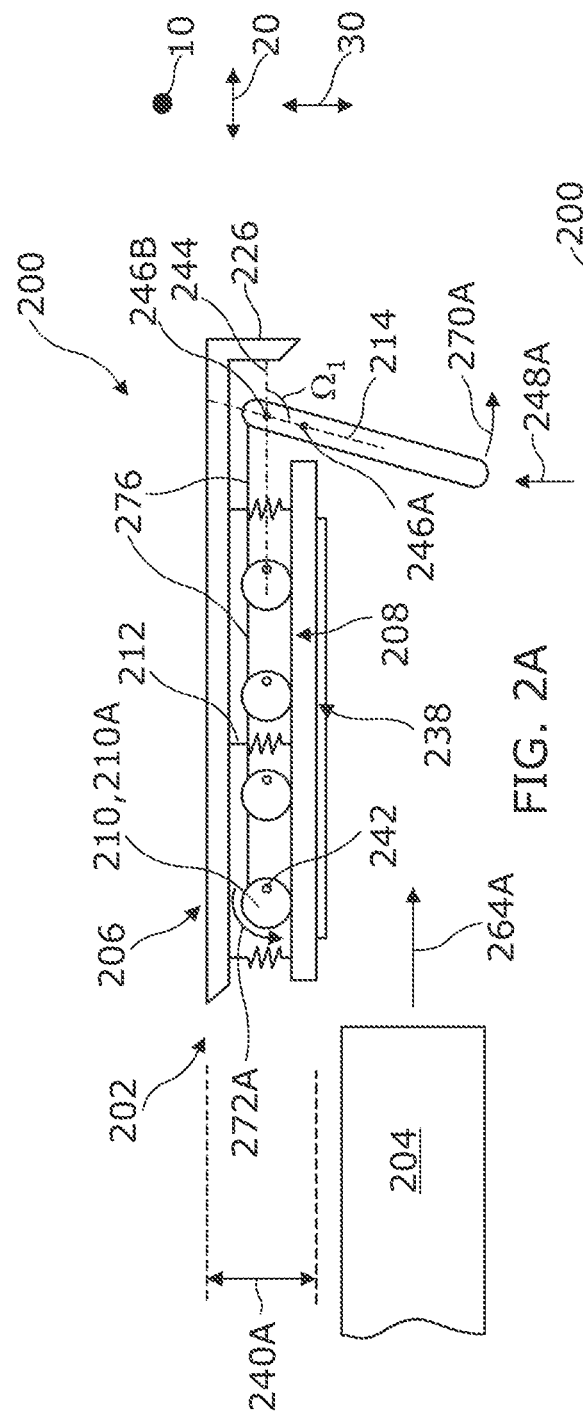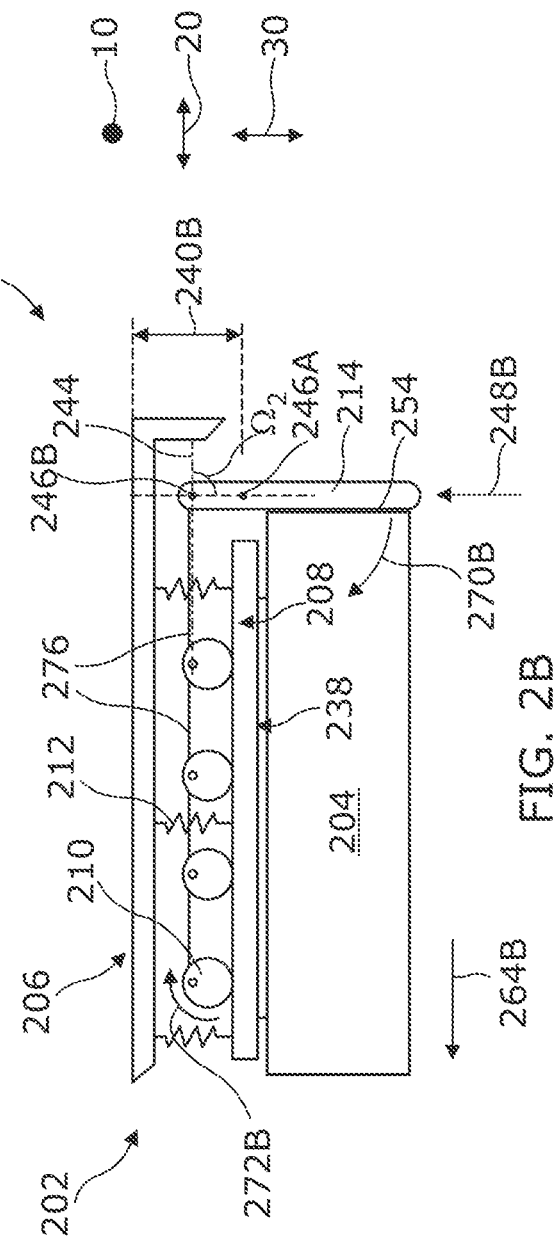

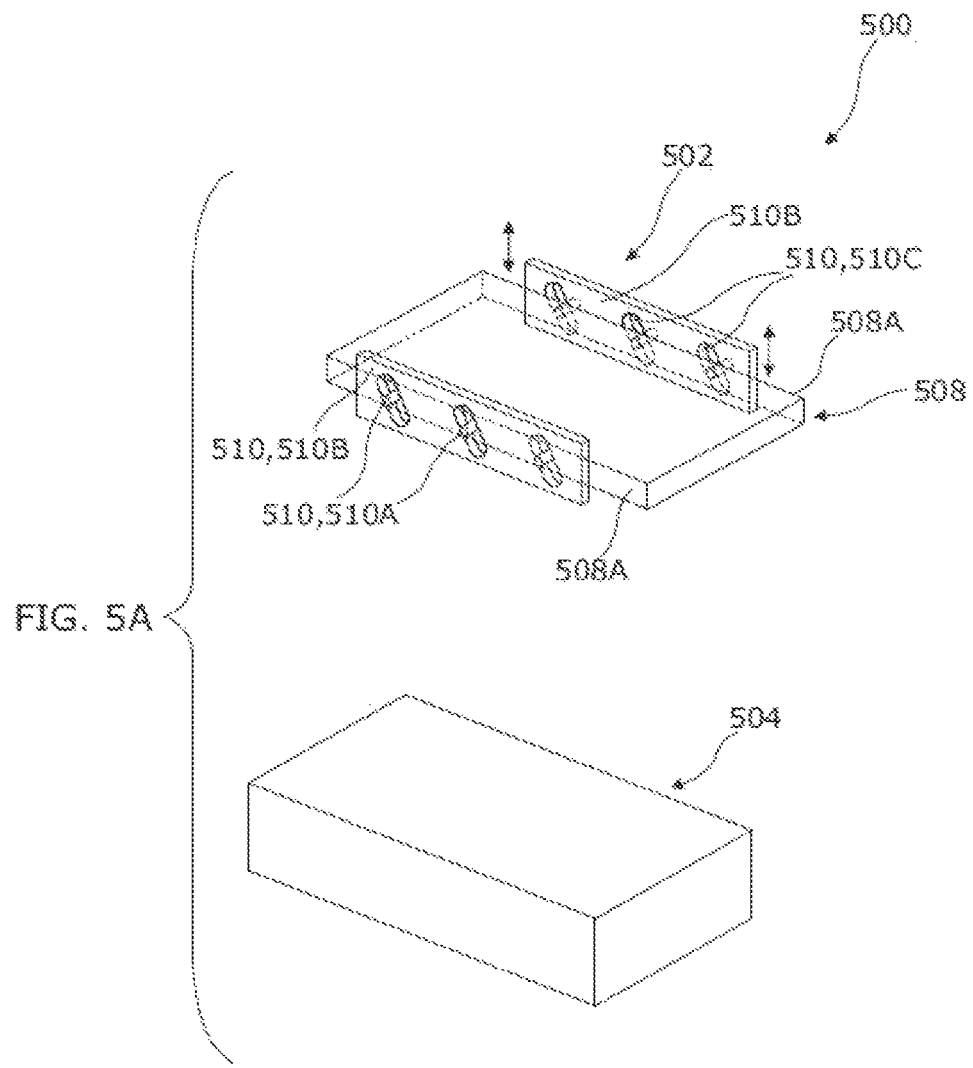

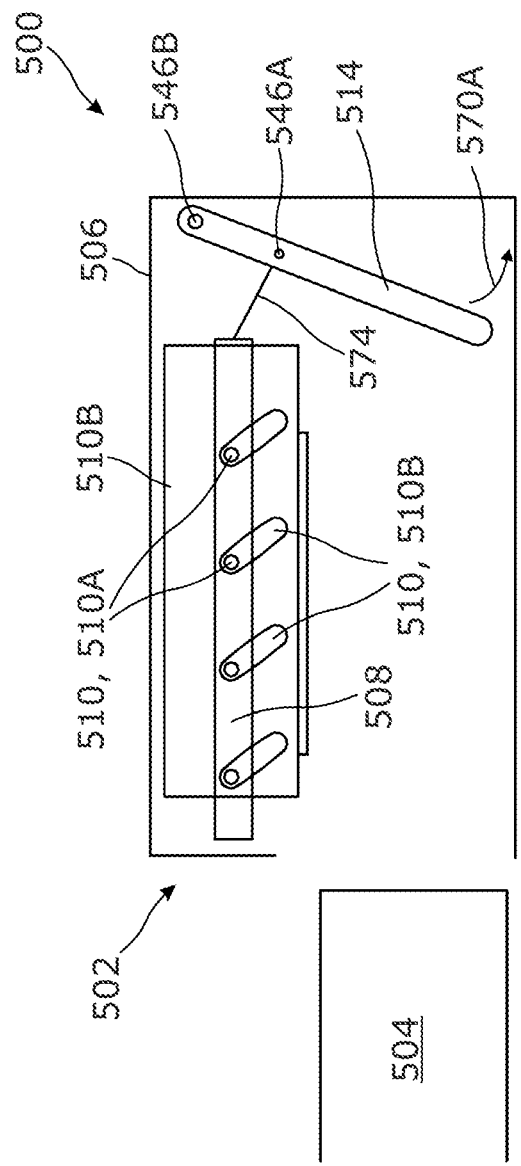
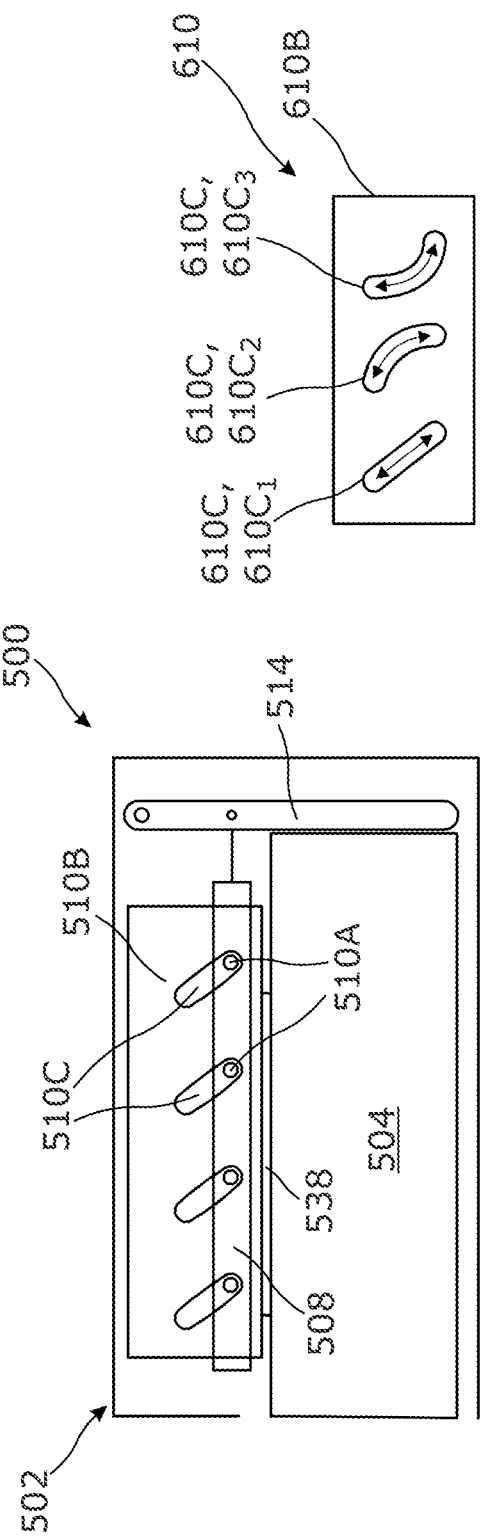

US 11,765,848 B2

HOST ELECTRONIC DEVICE HAVING A MOVABLE COOLING COMPONENT FOR REMOVABLE ELECTRONIC DEVICE

BACKGROUND

A removable electronic device, such as a small form-factor removable (SFP) transceiver device or a non-volatile memory express (NVMe) storage drive may be connected to a host electronic device, such as a server device for performing functions, such as transmitting data, receiving data, processing data, storing data, or the like. Thus, the removable electronic device may generate excessive waste-heat, while performing its respective functions. If adequate amount of the waste-heat is not dissipated from the removable electronic device, it may exceed thermal specifications of the removable electronic device, and thereby degrade the performance, reliability, and/or life expectancy of the removable electronic device, and may also cause its failure. Thus, the host electronic device may provide a cooling solution for regulating the waste-heat generated by the removable electronic device. For example, the host electronic device may establish a thermal path from the removable electronic device for dissipating the waste-heat from the removable electronic device.

BRIEF DESCRIPTION OF THE DRAWINGS

Various examples will be described below with reference to the following figures.

FIG. 1A is a block diagram depicting a side view of a computing system having a removable electronic device connecting to a host electronic device according to an example implementation of the present disclosure.

FIG. 1B is a block diagram depicting the side view of the computing system of FIG. 1A having the removable electronic device connected to the host electronic device according to an example implementation of the present disclosure.

FIG. 2A is a block diagram depicting a side view of a computing system having a removable electronic device connecting to a host electronic device according to another example implementation of the present disclosure.

FIG. 2B is a block diagram depicting the side view of the computing system of FIG. 2A having the removable electronic device connected to the host electronic device according to another example implementation of the present disclosure.

FIG. 5A is a perspective view of a portion a computing system having a removable electronic device and a host electronic device according to yet another example implementation of the present disclosure.

FIG. 5B is a block diagram depicting a side view of the portion of the computing system of FIG. 5A having the removable electronic device connecting to the host electronic device according to yet another example implementation of the present disclosure.

FIG. 5C is a block diagram depicting a side view of the portion of the computing system of FIG. 5A having the removable electronic device connected to the host electronic device according to yet another example implementation of the present disclosure.

FIG. 6 is a block diagram of a portion of a driver of a host electronic device according to yet another example implementation of the present disclosure.

DETAILED DESCRIPTION

Figure 3A:
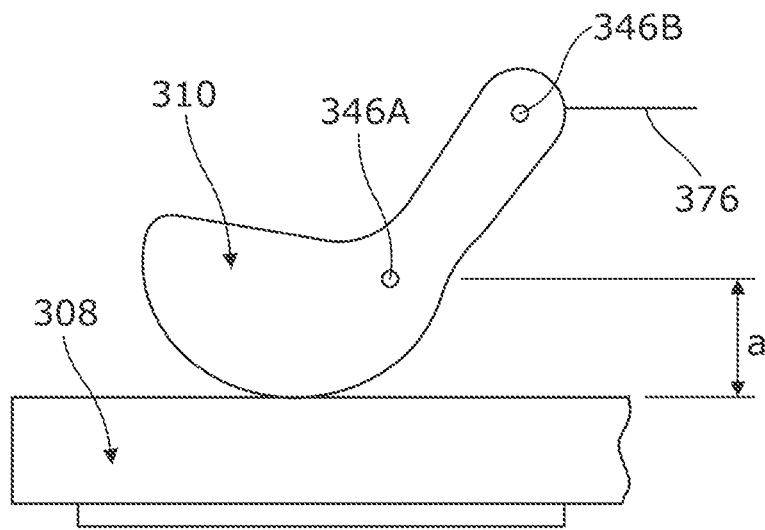
FIG. 3A is a block diagram depicting a side view of a driver and a cooling component disposed in a first position according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening element, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, and the term "including" means including but not limited to. The term "based on" means based at least in part on.

As used herein, the term "host electronic device" may refer to a type of computing device having a receptacle to receive and detachably connect to a connector of a removable electronic device. For example, the host electronic device may be a server device, a storage device, a power conversion device, or a networking device, or the like. As used herein, the term "removable electronic device" may refer to a type of pluggable device (swappable device), which is not native to the host electronic device, and which has to be inserted to detachably connect to the host electronic device. For example, the removable electronic device may be a transceiver device or a storage drive, or the like. As used herein, the term "computing system" may refer to a type of compute infrastructure, where the host electronic device and the removable electronic device may function as a socket and a plug, respectively. Further, as used herein, the term "movably connected" refers to attaching a component to a fixed component such that the component may move relative to the fixed component. In one example, a cooling component is movably coupled to a support structure or housing such that the cooling component can be moved between a first position and a second position, along a direction, which is perpendicular to a direction of a movement of the removable electronic device into the host electronic device. In another example, a driver may rotate or swing relative to its connection point on the support structure or the housing. In yet another example, the actuator may swing from an initial position to a deflected position (or over deflected position) relative to its connection point on the support structure or the housing. As used herein, the term "first position" may refer to a retracted position of the cooling component to form a gap between a thermal interfacing material of the cooling component and the removable electronic device disposed within the host electronic device. As used herein, the term "second position" may refer to an extended position of the cooling component to seat the thermal interfacing material on the removable electronic device. As used herein the term "biasing member" may refer to an elastic member that stores potential energy when it is compressed, stretched, or bent, and releases the stored potential energy when the restraining force is removed. For example, the biasing member may be a coil, a strip of steel, a wave spring, or the like.

As used herein the term "swing" or "swingable" or "swingable motion" may refer to an oscillation movement of a component relative to a connection point. In one example, an actuator may oscillate from an initial position to a deflection position (or over deflected position) relative to its connection point on the support structure. In another example, the driver may oscillate relative to its connection point on the support structure. As used herein the term "actuate" may refer to a movement on a driver caused by the oscillation movement of the actuator. The term "initial position" may refer to an inclined position of the actuator relative to a longitudinal axis that is parallel to a direction of movement of the removable electronic device into the host electronic device. The term "deflected position" may refer to a shift in the position of the actuator from the (initial) tilted position to a new position caused because of the movement of the removable electronic device into the host electronic device. The term "over deflected position" may refer to a shift in the position of the actuator from the deflected position to yet another new position caused because of an over travel (movement) of the removable electronic device into the host electronic device.

Further, as used herein, the term "thermal contact" may refer to forming a thermal interface between surfaces of two components to allow the transfer of waste-heat therebetween the two components. As used herein the term "cooling component" may refer to a type of thermally conductive component that contains fluid conduits to circulate liquid coolant for absorbing the waste-heat that is transferred to the cooling component from a heating component. Further, the term "heating component" may refer to a type of a passive heat exchanger that transfers the waste-heat generated by a heat generating component to the cooling component. As used herein the term "heat generating component" may refer to a circuit board of the removable electronic device, or one or more electronic components mounted on the circuit board. It may be noted herein: an object, device, or assembly (which may comprise multiple distinct bodies that are thermally coupled, and may include multiple different materials), is in "thermal contact" or is "thermally conductive" between two surfaces (that form the interface), if any one of the following is true: (i) a temperature difference between the two surfaces results in heat flux through the interface, (ii) the object is a continuous piece of a material that has a thermal conductivity (often denoted k, λ, or κ) between the interface of about 200 W/mK to about 5000 W/mK, or (iii) the object is a continuous body of copper, or continuous body of aluminum. Examples of materials whose thermal conductivity is between aforementioned ranges include certain types of copper, aluminum, silver, or gold, for example.

For purposes of explanation, certain examples are described with reference to the components illustrated in FIGS. 1-9. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIGS. 1-9 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A removable electronic device, for example, a communication device or a storage drive may be a hot-pluggable electronic device or drive used for transferring, receiving, processing, or storing data. In some examples, the communication device, for example, a transceiver when connected to a host electronic device, such as a networking device may convert electrical signals into optical signals or vice versa for transmitting or receiving data. Accordingly, the transceiver may consume a greater amount of power to convert the signals, and thereby produce excessive waste-heat. In some other examples, the storage drive, for example, a non-volatile memory express (NVMe) storage drive, when connected to the host electronic device such as the server device, may process, store, or transfer data. Accordingly, the NVMe storage drive may consume a greater amount of power to process, store, or transfer data, and thereby produce excessive waste-heat.

In such examples, if the excessive waste-heat produced by the removable electronic device is not adequately dissipated, it may degrade the removable electronic device's performance, reliability, and/or life expectancy and may also cause its failure. Accordingly, a heat sink that is thermally coupled to a heat generating component of the removable electronic device may be used to dissipate the waste-heat from the removable electronic device, and a cooling air passing over the heat sink may be used to remove the waste-heat from the heat sink. However, when the removable electronic device is connected to the host electronic device, the heat sink may not receive adequate supply of the cooling air to remove the waste-heat from the heat sink. Thus, the host electronic device may provide a cooling component for removing the waste-heat from the heat sink. In such examples, the cooling component may establish a thermal interface (or thermal contact) with the heat sink to transfer the waste-heat from the heat sink to the cooling component for removing the waste-heat from the heat sink. However, maintaining the thermal contact between the cooling component and the heat sink (i.e., between two interfacing surfaces) may be difficult, as the interfacing surfaces may not have flat and/or smooth surfaces. Also, the accumulation of debris and/or surface imperfections (i.e., scratches, dents, or the like) may compromise the heat transfer between the interfacing surfaces. Further, it may be difficult to generate an optimal contact force/pressure to maintain the thermal contact between the interfacing surfaces.

In order to address the aforementioned issues, a thermal interfacing material, such as a thermal gap pad, a thermal grease, a thermal foam, thermally conductive spring fingers, or the like may be used in-between the interfacing surfaces. For example, the thermal interfacing material may be coupled to the cooling component for establishing the thermal contact with the heat sink, when the removable electronic device is connected to the host electronic device. In such examples, the heat sink may slide through (or rub) the entire thermal interfacing material during connecting and/or disconnecting of the removable electronic device, thereby damaging the thermal interfacing material, especially when the thermal interfacing material is small in size and/or fragile in nature. Further, repetitive connecting and/or disconnecting of the removable electronic device may result in peeling off/damaging of the thermal interfacing material over a period of time. Similarly, repetitive connecting and/or disconnecting of the removable electronic device may make the thermal interfacing material such as the thermal grease messy, and may cause the thermal interfacing material to be easily scraped off from the host electronic device. Further, the thermal interfacing material may exert a contact force opposing an insertion force applied to connect the removable electronic device to the host electronic device or a removal force applied to disconnect the removable electronic device from the host electronic device. In such examples, maintaining an optimal contact force, which is within acceptable safety limits to avoid repetitive force (e.g., insertion force or removal force) related damage is extremely difficult. Further, the cooling component having a thermal interfacing material may be directly exposed to an external environment when the removable electronic device is not connected to the host electronic device, or when a space (hollow cavity) of the host electronic device is left empty, or when the host electronic device is not in use. This may result in accumulation of foreign objects, debris, or the like, on the thermal interfacing material, thereby damaging the thermal interfacing material.

A technical solution to the aforementioned problems includes presenting a host electronic device having a cooling component that is movable to provide a non-interfering path for a movement of a removable electronic device into the host electronic device and/or from the host electronic device. In other words, the cooling component is movable to allow connecting/disconnecting of the removable electronic device into/from the host electronic device, without contacting a thermal interfacing material of the cooling component during the movement of the removable electronic device in and out of the host electronic device. For example, the cooling component is held in a first position (retracted position) during movement of the removable electronic device into the host electronic device and/or movement of the removable electronic device out of the host electronic device. Similarly, the cooling component is held in a second position (extended position) when the removable electronic device is connected to the host electronic device, for establishing a thermal contact with the removable electronic device. Hence, the removable electronic device does not slide through (or rub) the thermal interfacing material during connecting and/or disconnecting of the removable electronic device from the host electronic device. Accordingly, the movable cooling component may prevent damages to the thermal interfacing material that may otherwise be caused due to rubbing of the removable electronic device against the thermal interface material during the movement of the removable electronic device in and out of the host electronic device. Further, the removable electronic device may be easily connected and/or disconnected into and/or from the host electronic device, since the cooling component does not interfere with the movement of the removable electronic device, thereby preventing repetitive force (e.g., insertion force or removal force) related damage.

In one or more examples, the host electronic device includes a biasing member and a driver movably connected to a support structure of the host electronic device. In such examples, a cooling component of the host electronic device is movably connected to the support structure via the biasing member. Moreover, the driver is further connected to the cooling component and an actuator of the host electronic device. In one or more examples, the biasing member in the retracted state, holds the cooling component in a first position and the actuator in an initial position via the driver. In such examples, the removable electronic device deflects the actuator from the initial position to a deflected position during its movement into the host electronic device, so as to actuate the driver to push the biasing member from the retracted state to the biased state, and the cooling component from the first position to a second position. Accordingly, after the removable electronic device is almost fully inserted into the host electronic device, the cooling component is moved to the second position to establish a thermal contact with the removable electronic device. In some examples, during the movement of the removable electronic device out of the host electronic device, the biasing member pulls the cooling component back to the first position from the second position, and the driver to move the actuator back to the initial position from the deflected position. Accordingly, when the removable electronic device is started to be withdrawn (removed) from the host electronic device, the cooling component is moved back to the first position so as to disestablish the thermal contact with the removable electronic device.

In some examples, the host electronic device may include a retraction mechanism disposed in contact with the actuator. In such examples, the actuator, upon contact by the removable electronic device, moves to the deflected position and causes the retraction mechanism to engage with the removable electronic device. In some examples, the removable electronic device may over travel within the host electronic device, resulting in moving the actuator further from the deflected position to an over deflected position. In such examples, even when the removable electronic device is withdrawn from the host electronic device, the biasing member may not be able to apply retraction force on the actuator via the driver, to move the actuator back to the initial position from the over deflected position. Accordingly, in such examples, the removable electronic device, upon withdrawal from the host electronic device, causes the retraction mechanism to pull the actuator from the over deflected position to the deflected position. Thereby, allowing the biasing member to apply the retraction force on the actuator via the driver to pull it back to the initial position from the deflected position, and disengage the retraction mechanism from the removable electronic device.

In some other examples, a free end of the actuator, and a distal end of the removable electronic device may be modified to have a curved shape profile and a hook shaped profile, respectively. Accordingly, such modified profiles of the actuator and the removable electronic device may collectively function as the retraction mechanism to pull the actuator back to the deflected position from the over deflected position, as discussed hereinabove without deviating from the scope of the present disclosure.

Accordingly, the present disclosure describes example implementations of a host electronic device for establishing a thermal contact with a removable electronic device and/or disestablishing the thermal contact with the removable electronic device, when the removable electronic device is plugged in and/or plugged out of the host electronic device. The host electronic device includes a support structure, a cooling component, a driver, and an actuator. The cooling component and the driver are movably connected to the support structure. The actuator is movably connected to the support structure and the driver. Further, the actuator, upon contact by a removable electronic device, causes a movement of the cooling component via the driver, for establishing the thermal contact between the cooling component and the removable electronic device.

FIG. 1A depicts a side view of a computing system 100 having a host electronic device 102 and a removable electronic device 104 connecting to the host electronic device 102. In some examples, the computing system 100 is a compute infrastructure having the host electronic device 102, such as a server device, a storage device, a power conversion device, or a networking device, and the removable electronic device 104, such as a data communication device, or a storage drive. The computing system 100 may include a plurality of containment blocks (not shown) attached to a rack (not shown) of the computing infrastructure, where each containment block may house the host electronic device 102. In other words, each containment block may provision insertion and/or removal of the host electronic device 102 into and/or from the rack of the computing system 100. In some examples, the containment box may be an integral part of the computing system 100 or may be a modular component, which may be attached/ coupled to the rack. As discussed herein, the computing system 100 includes the host electronic device 102 and the removable electronic device 104.

In some examples, the host electronic device 102 is a networking device having a switch, such as an Ethernet switch. In some other examples, other types of the host electronic device 102, such as a server device, a storage device, a power conversion device, or the like, may be envisioned without deviating from the scope of the present disclosure. The host electronic device 102 includes a housing 106, a cooling component 108, a plurality of drivers 110, a plurality of biasing members 112, a pair of actuators 114 (only one actuator is shown in FIG. 1A), a fluid conduit 116, and a receptacle 118 (i.e., power and signal connector). The host electronic device 102 may further include a host circuit board (not shown) coupled to the receptacle 118 for receiving, transmitting, and processing data from the removable electronic device 104.

The housing 106 may be a hollow component having a slot 120 to house a plurality of components of the host electronic device 102. The plurality of components may include the cooling component 108, the plurality of drivers 110, the plurality of biasing members 112, the pair of actuators 114 (only one actuator is shown in FIG. 1A), a portion of the fluid conduit 116, and the receptacle 118. In some examples, the housing 106 may be formed by a container portion 106A and a cover portion 106B. In such examples, the cover portion 106B may be disposed on and coupled to the container portion 106A to define the slot 120 therebetween. In some examples, the container portion 106A may be a box shaped component defined by a pair of peripheral walls 122 (only one peripheral wall is shown), a front panel 124, a rear panel 126, and a base 128. In such examples, the pair of peripheral walls 122 are spaced apart from one another and coupled to the front panel 124, the rear panel 126, and the base 128 to form the slot 120 therebetween. Further, the front panel 124 has an inlet opening 130 for receiving the removable electronic device 104. The rear panel 126 has an outlet opening 132 for receiving a portion of the receptacle 118 of the host electronic device 102. The container portion 106A further includes the receptacle 118 coupled to the outlet opening 132 formed on the rear panel 126 of the housing 106. The receptacle 118 faces the inlet opening 130 for receiving and connecting to a connector 152 of the removable electronic device 104. In some examples, the cover portion 106B may also be a box shaped component having a lip wall 134 and a lid 136. The lip wall 134 may cover a thermal interfacing material 138 of the cooling component 108 from an external environment, when the cooling component 108 is held in a first position (retracted position), as discussed in greater details below.

The cooling component 108 in some examples, is a cold plate that is moveably connected to the housing 106. For example, the cooling component 108 is a liquid-cooling component having the fluid conduit 116 fluidically connected to the cooling component 108. For example, the cooling component 108 may have an internal fluid channel (not shown) connected to a fluid inlet 108A and a fluid outlet (not shown) of the cooling component 108. Further, the fluid inlet 108A and the fluid outlet may be connected to an inlet fluid conduit 116A and an outlet fluid conduit (not shown) respectively, of the fluid conduit 116. In such examples, the inlet fluid conduit 116A may be in a fluid communication with a pump (not shown) of the computing system 100, and the outlet fluid conduit may be in fluid communication with a coolant distribution unit (CDU, not shown) of the computing system 100. Accordingly, the inlet fluid conduit 116A may receive a coolant liquid from the pump, circulate the coolant liquid through the internal fluid channel for absorbing a waste-heat (transferred to the cooling component 108 from the removable electronic device 104) and generate a heated liquid. In such example, the outlet fluid conduit may later direct the heated liquid to the CDU for regenerating the coolant liquid and directing the regenerated coolant liquid to the pump. In some examples, the cooling component 108 and the fluid conduit 116 may include a thermally conductive material, for example, a copper material, an aluminum material, or the like. The cooling component 108 further includes a thermal interfacing material 138 coupled to an inner surface of the cooling component 108 using thermal conductive soldering materials. In one or more examples, the thermal interfacing material 138 may be at least one of a thermal gap pad, a thermal grease, a thermal foam, or a plurality of thermal conductive spring fingers. In the example of FIG. 1A, the thermal interfacing material 138 is a thermal gap pad. In one or more examples, the thermal interfacing material 138 may overcome the issues related to the inner surface of the cooling component 108 not having a smooth or a flat surface for establishing a thermal contact with the removable electronic device 104. In some examples, the thermal interfacing material 138 may include the thermally conductive material, for example, a copper material, an aluminum material, or the like.

The plurality of drivers 110 are spaced apart from one another along a lateral direction 10 and a longitudinal direction 20. As used herein, the term "lateral direction" may refer to a perpendicular direction (sidewise) relative to a direction of movement of the removable electronic device 104 into and/or out of the host electronic device 102. As used herein, the term "longitudinal direction" may refer to a direction that is parallel to the direction of movement of the removable electronic device 104 into and/or out of the host electronic device 102. The plurality of drivers 110 are moveably connected to the pair of peripheral walls 122 of the housing 106. In the example of FIG. 1A, each of the plurality of drivers 110 is a lever mechanism 110A. In some examples, each driver 110 is a rigid bar having a pair of connection points 142A, 142B. In such examples, a first connection point 142A of each driver 110 is movably connected to the corresponding peripheral wall of the pair of peripheral walls 122 via a driver bar (not shown), for example. Further, the second connection point 142B of each driver 110 is pivotably connected to a corresponding peripheral wall (not labeled) of a pair of peripheral walls in the cooling component 108 via a first housing bar (not shown), for example. In the example of FIG. 1A, each of the plurality of drivers 110 is held at a first angle "$\alpha_1$" relative to a longitudinal axis 144 that extends along the plurality of second connection points 142B. The longitudinal axis 144 is the axis that extends along the longitudinal direction 20. In some non-limiting examples, the first angle "$\alpha_1$" is about −120 degrees. In such examples, each of the plurality of drivers 110 may have swinging motion relative to the first connection point 142A.

The plurality of biasing members 112 are spaced apart from one another along the lateral direction 10 and the longitudinal direction 20. Further, the plurality of biasing members are coupled to the lid 136 of the housing 106. For example, one end portion of each biasing member 112 is coupled to an inner surface of the lid 136 and another end portion of each biasing member 112 is coupled to an outer surface of the cooling component 108. In such examples, the cooling component 108 is movably connected to the housing 106 via the plurality of biasing members 112. In some examples, the plurality of biasing members 112 may have linear motion along a radial direction 30. As used herein, the term "radial direction" may refer to a direction that is perpendicular (lengthwise) to the direction of movement of the removable electronic device 104 into and/or out of the host electronic device 102. In some examples, each of the plurality of biasing members 112 is a coil spring 112A. In some other examples, each of the plurality of biasing members 112 may be a spring finger, a bellow, a diaphragm, or the like without deviating from the scope of the present disclosure.

The pair of actuators 114 are disposed spaced apart from one another along the lateral direction 10, and moveably connected to the pair of peripheral walls 122 of the housing 106. The pair of actuators 114 are disposed proximate to the rear panel 126 of the container portion 106A in the housing 106. In the example of FIG. 1A, each actuator of the pair of actuators 114 is a rigid arm having a pair of connection points 146A, 146B. In such examples, a first connection point 146A of each actuator 114 is movably connected to the corresponding peripheral wall of the pair of peripheral walls 122 in the housing 106 via an actuator bar (not shown), for example. Further, the second connection point 146B is connected (i.e., pivotably connected) to the corresponding peripheral wall (not labeled) of the pair of peripheral walls in the cooling component 108 via a second housing bar (not shown), for example. In the example of FIG. 1A, each of the pair of actuators 114 is held at a first angle "$\beta_1$" relative to the longitudinal axis 144 that extends along the second connection point 146B. In some non-limiting examples, the first angle "$\beta_1$" is about −120 degrees. In one or more examples, the first angles "$\alpha_1$", "$\beta_1$" are substantially equal. In some examples, the horizontal axis 144 extends along the plurality of second connection points 142B of the plurality of drivers 110, and the second connection point 146B of the corresponding actuator 114. In such examples, each of the pair of actuators 114 may have swinging motion relative to the first connection point 146A. In one or more examples, each actuator of the pair of actuators 114 is movably connected to the plurality of drivers 110 via the cooling component 108.

In one or more examples, the plurality of biasing members 112 are in a retracted state, holding the cooling component 108 in the first position 140A. As used herein, the term "retracted state" may refer to a state of the plurality of biasing members 112, in which potential energy stored in the biasing members 112 is released by relaxing the coil springs 112A, for example. The first position 140A may be indicative of a radial distance between the lid 136 of the housing 106, and the cooling component 108. In such examples, the plurality of biasing members 112 in the retracted state may hold the pair of actuators 114 in an initial position 148A via the plurality of drivers 110. In some examples, the initial position 148A may be indicative of a tilted position held at the first angle "$\beta_1$" relative to the longitudinal axis 144 extending along the second connection point 146B.

In some examples, the removable electronic device 104 is a data communication device having a transceiver, such as a small form-factor pluggable (SFP) transceiver or a quad small form-factor pluggable (QSFP) transceiver. In some other examples, other types of the removable electronic device 104, such as the storage drive, for example, a non-volatile memory express (NVMe) storage drive, or the like may be envisioned without deviating from the scope of the present disclosure. The removable electronic device 104 may include an electromagnetic induction (EMI) casing 150, a heat generating component, such as a circuit board (not shown) and a plurality of electronic components (not shown), a heat spreader (not shown), and a connector 152.

The EMI casing 150 may have a plurality of peripheral walls, a front panel 154 having the connector 152, a rear panel 156 having a handle 158, and a hollow chamber formed therebetween. The circuit board may be disposed within the hollow chamber and the plurality of electronic components may be mounted on the circuit board. Further, the circuit board may be communicatively coupled to the connector 152. In some examples, the EMI casing 150 may shield the circuit board and the plurality of electronic components from EMI emissions and improve the reliability of the removable electronic device 104.

In some examples, a heat spreader 160, such as a heat sink may be disposed in the hollow chamber such that the heat spreader 160 is in a thermal contact with the heat generating component. For example, the heat spreader may be coupled to at least one or more electronic components and the portion of the circuit board. The heat spreader 160 is configured to dissipate a waste-heat from the heat generating component to an outer surface 162 of the heat spreader 160. In some examples, the heat spreader 160 may include a vapor chamber filled with a coolant liquid. In one or more examples, the heat spreader 160 may include the thermally conductive material, for example, the copper material, the aluminum material, or the like.

In one or more examples, when the removable electronic device 104 is moved (slidably inserted) into the host electronic device 102, the connector 152 of the removable electronic device 104 is connected to the receptacle 118 of the host electronic device 102. In such examples, the circuit board of the removable electronic device 104 is communicatively coupled to the host circuit board of the host electronic device 102 via the connector 152 and the receptacle 118.

FIG. 1B depicts the side view of the computing system 100 of FIG. 1A having the removable electronic device 104 connected to the host electronic device 102. As discussed herein, before the removable electronic device 104 is moved into (connected to) the host electronic device 102, the biasing member 112 may hold the cooling component 108 in the first position 140A, and the pair of actuators 114 in the initial position 148A via the plurality of drivers 110. In other words, the cooling component 108 may not interfere with the movement of the removable electronic device 104 into the host electronic device 102 until the removable electronic device 104 contacts the pair of actuators 114.

Referring to FIGS. 1A-1B, when an insertion force is applied on the removable electronic device 104 along a first direction 164A, the removable electronic device 104 starts to move inside the slot 120 of the host electronic device 102 via the inlet opening 130. It may be noted herein that the first direction may correspond to the longitudinal direction 20. As the removable electronic device 104 is moved inside the slot 120 of the host electronic device 102, the front panel 154 of the removable electronic device 104 contacts the pair of actuators 114. As the insertion force is further applied on the removable electronic device 104, the front panel 154 deflects the pair of actuators 114 from the initial position 148A to a deflected position 148B. In other words, the removable electronic device 104, upon contacting the pair of actuators 114, may cause the pair of actuators 114 to swing along a counterclockwise direction 170A, relative to the first connection point 146A, thus resulting in moving the pair of actuators 114 from the initial position 148A to the deflected position 148B. In such examples, the pair of actuators 114 may actuate the plurality of drivers 110 (in parallel) to push the cooling component 108 from the first position 140A to a second position 140B, and the plurality of biasing members 112 from the retracted state to a biased state. As used herein, the term "biased state" may refer to a condition of the plurality of biasing members 112, in which potential energy is stored in the plurality of biasing members 112 by expanding the coil springs, for example. The second position 140B may be indicative of an extended radial distance between the lid 136 of the housing 106, and the cooling component 108. In some examples, the pair of actuators 114 may cause the plurality of drivers 110 to swing along a counterclockwise direction 172A to further move the cooling component 108 from the first position 140A to the second position 140B so as to establish a thermal contact between the thermal interfacing material 138 in the cooling component 108 and the outer surface 162 of the heat spreader 160 in the removable electronic device 104. In some examples, the radial distance between the cooling component 108 in the second position 140B and the lid 136 is greater than the radial distance between the cooling component 108 in the first position 140A and the lid 136. In the example of FIG. 1B, each of the pair of actuators 114 in the deflected position 148B is held at a second angle "$\beta_2$" relative to the longitudinal axis 144 extending along the second connection point 146B. In some examples, the deflected position 148B may be indicative of a vertical position held at the second angle "$\beta_2$" relative to the longitudinal axis 144 extending along the second connection point 146B. In some non-limiting example, the second angle "$\beta_2$" is about −90 degree. Similarly, each of the plurality of drivers 110 is held at a second angle "$\beta_2$" relative to the longitudinal axis 144 extending along the plurality of second connection points 142B. In some non-limiting example, the second angle "$\alpha_2$" is about −90 degrees. In one or more examples, the second angles "$\alpha_2$", "$\beta_2$" are substantially equal. Since the pair of actuators 114 are disposed proximate to the rear panel 124 of the host electronic device 102, the actuator 114 and the cooling component 108 do not interfere with the movement of the removable electronic device 104 into the host electronic device 102, until when the removable electronic device 104 is almost fully inserted into the host electronic device 102 to contact the pair of actuators 114. This allows a seamless movement of the removable electronic device 104 into the host electronic device 102 without contacting the thermal interfacing material 138 of the cooling component 108.

In some examples, a first thermal conduction path is established between the heat generating component and the heat spreader 160, so as to transfer a waste-heat from the heat generating component to the heat spreader 160. Further, a second thermal conduction path is established between the heat spreader 160 and the cooling component 108 via the thermal interfacing material 138, so as to dissipate the waste-heat from the heat spreader 160 to the cooling component 108. Later, a third thermal conduction path is established between the cooling component 108 and a coolant liquid (not shown) circulating within the internal fluid channel of the cooling component 108, via the fluid conduit 116 so as to transfer the waste-heat from the cooling component 108 to the coolant liquid and generate a heated liquid (not shown). As discussed herein, the heated liquid is directed to the CDU (not shown) to regenerate the coolant liquid.

Further, when a withdrawal force is applied on the removable electronic device 104 along a second direction 164B opposite to the first direction 164A, the removable electronic device 104 starts to move outside the slot 120 of the host electronic device 102 via the inlet opening 130. In such examples, the plurality of biasing members 112 starts to move from the biased state to the retracted state, causing the cooling component 108 to move from the second position 140B to the first position 140A, and the plurality of drivers 110 to swing along a clockwise direction 172B. In one or more examples, the plurality of drivers 110 may cause the pair of actuators 114 to swing along a clockwise direction 170B to move back to the initial position 248A from the deflected position 248B. Since the pair of actuators 114 start to disconnect as soon as the removable electronic device 104 is withdrawn from the host electronic device 102, the plurality of biasing members 112 pulls the cooling component 108 to the first position 140A, thereby providing a non-interfering path for the removal of the removable electronic device 104 from the host electronic device 102. In other words, the thermal interfacing material 138 of the cooling component 108 does not interfere with the movement of the removable electronic device 104, when the removable electronic device 104 is moved out of (withdrawn from) the host electronic device 102. Accordingly, the host electronic device 102 allows a seamless movement of the removable electronic device 104 out of the host electronic device 102 without contacting the thermal interfacing material 138 of the cooling component 108.

FIG. 2A depicts a side view of a computing system 200 having a host electronic device 202 and a removable electronic device 204 connecting to the host electronic device 202. FIG. 2B depicts the side view of the computing system 200 of FIG. 2A having the removable electronic device 204 connected to the host electronic device 202.

In some examples, the computing system 200 is a compute infrastructure having the host electronic device 202, such as a server device, a storage device, a power conversion device, or a networking device, and the removable electronic device 204, such as a data communication device, or a storage drive. The host electronic device 202 includes a support structure 206, a cooling component 208, a plurality of drivers 210, a plurality of biasing members 212, and a pair of actuators 214. It may be noted herein that the host electronic device 202 may include a fluid conduit and a receptacle as depicted in the example implementation of FIG. 1A.

In some examples, the support structure 206 may be formed by struts that extend along a lateral direction 10 and a longitudinal direction 20. The support structure 206 may hold a plurality of components of the host electronic device 202, for example, the cooling component 208, the plurality of drivers 210, the plurality of biasing members 212, and the pair of actuators 214. In some examples, the cooling component 208, for example, a cold plate is moveably coupled to the support structure 206. The cooling component 208 includes a thermal interfacing material 238 coupled to an inner surface of the cooling component 208 using thermal conductive soldering materials. In the example of FIG. 2A, the thermal interfacing material 238 is a thermal gap pad. In some examples, the plurality of drivers 210 are spaced apart from one another along the lateral direction 10 and the longitudinal direction 20. Further, the plurality of drivers 210 are mounted on the cooling component 208 and moveably connected to the support structure 206. In the example of FIG. 2A, each of the plurality of drivers 210 is a cam 210A having a connection point 242. In such examples, each cam 210A is movably connected to the strut that extends along the lateral direction 10. In such examples, each of the plurality of cams 210A may rotate relative to the connection point 242. In some examples, the plurality of biasing members 212 are spaced apart from one another along the lateral direction 10 and the longitudinal direction 20. Further, the plurality of biasing members 212 are coupled to the struts of the support structure 206. For example, one end portion of each biasing member 212 is coupled to an inner surface of the struts that extend along the longitudinal direction 20 and another end portion of each biasing member 212 is coupled to an outer surface of the cooling component 208. In such examples, the cooling component 208 is movably connected to the support structure 206 via the plurality of biasing members 212. In some examples, the plurality of biasing members 212 may have linear motion along a radial direction 30. In some examples, the pair of actuators 214 are disposed spaced apart from one another along the lateral direction 10. Further, the pair of actuators 214 are disposed proximate to the rear end 224 of the support structure 206. In the example of FIG. 2A, each actuator of the pair of actuators 214 has a pair of connection points 246A, 246B. In such examples, a first connection point 246A of each actuator 114 is connected (i.e., pivotably connected) to a corresponding strut that extends along the lateral direction 10. Further, the second connection point 246B of each actuator 214 is movably connected to another strut that extends along the lateral direction 10. In the example of FIG. 2A, each actuator of the pair of actuators 214 is held at a first angle "$\Omega_1$" relative to a longitudinal axis 244 that extends along the second connection point 246B. In some non-limiting examples, the first angle "$\Omega_1$" is about −120 degrees. In such examples, each actuator of the pair of actuators 214 may have swinging motion relative to the first connection point 246A. Further, each actuator of the pair of actuators 214 is movably connected to the plurality of drivers 210 via a plurality of linkages 276 extending from the second connection point 246B. In the example of FIG. 2A, the plurality of biasing members 212 is in a retracted state, holding the cooling component 208 in the first position 240A and the pair of actuators 214 in an initial position 248A via the plurality of drivers 210.

The removable electronic device 204 may be substantially similar to a removable electronic device 104 of FIGS. 1A-1B, discussed hereinabove. It may be noted herein that one or more components of the removable electronic device 204, such as the connector 152 and the heat spreader 160 shown in FIGS. 1A-1B, are not depicted in FIG. 2A for ease of illustration purpose, and such an illustration should not be construed as a limitation of the present disclosure.

As discussed hereinabove, before the removable electronic device 204 is moved into (connected to) the host electronic device 202, the biasing member 212 may hold the cooling component 208 in the first position 240A, and the pair of actuators 214 in the initial position 248A via the plurality of drivers 210. Thus, the cooling component 208 may not interfere with the movement of the removable electronic device 204 into the host electronic device 202 until the removable electronic device 204 contacts the pair of actuators 214.

Referring to FIGS. 2A-2B, when an insertion force is applied on the removable electronic device 204 along a first direction 264A, the removable electronic device 204 starts to move inside the host electronic device 202. As the removable electronic device 204 is moved inside the host electronic device 202, a front panel 254 of the removable electronic device 204 contacts the pair of actuators 214. As the insertion force is further applied on the removable electronic device 204, the front panel 254 deflects the pair of actuators 214 from the initial position 248A to a deflected position 248B. In other words, the removable electronic device 204, upon contacting the pair of actuators 214 may cause the pair of actuators 214 to swing along a counter-clockwise direction 270A, relative to the first connection point 246A, thus resulting in moving the pair of actuators 214 from the initial position 248A to the deflected position 248B. In such examples, the pair of actuators 214 may actuate the plurality of drivers 210 (in parallel) via the plurality of linkages 276 to push the cooling component 208 from the first position 240A to a second position 240B, and the plurality of biasing members 212 from the retracted state to a biased state. In other words, the pair of actuators 214 may cause the plurality of drivers 210 to rotate along a counterclockwise direction 272A to radially move the cooling component 208 from the first position 240A to the second position 240B so as to establish a thermal contact between the thermal interfacing material 238 in the cooling component 208 and the removable electronic device 204. In some examples, the radial distance between the cooling component 208 in the second position 240B and the support structure 206 is greater than the radial distance between the cooling component 208 in the first position 240A and the support structure 206. In the example of FIG. 2B, each actuator of the pair of actuators 214 in the deflected position 248B is held at a second angle "$\Omega_2$" relative to the longitudinal axis 244 extending along the second connection point 246B. In some non-limiting examples, the second angle "$\Omega_2$" is about −90 degrees. Since the pair of actuators 214 are disposed proximate to a rear end 226 of the host electronic device 202, the actuators 214 and the cooling component 208 do not interfere with the movement of the removable electronic device 204 into the host electronic device 202, until when the removable electronic device 204 is almost fully inserted into the host electronic device 202 to contact the pair of actuators 214. This allows a seamless movement of the removable electronic device 204 into the host electronic device 202 without contacting the thermal interfacing material 238 of the cooling component 208.

Further, when a withdrawal force is applied on the removable electronic device 204 along a second direction 264B opposite to the first direction 264A, the removable electronic device 204 starts to move outside the host electronic device 202. In such examples, the plurality of biasing members 212 start to move from the biased state to the retracted state, causing the cooling component 208 to move from the second position 240B to the first position 240A, and the plurality of drivers 210 to rotate along a clockwise direction 272B. In one or more examples, the plurality of drivers 210 may pull the pair of actuators 214 via the plurality of linkages 276 to cause the pair of actuators 214 to swing along a clockwise direction 270B to move back to the initial position 248A from the deflected position 248B. Since the pair of actuators 214 start to disconnect as soon as the removable electronic device 204 is withdrawn from the host electronic device 202, the plurality of biasing members 212 pull the cooling component 208 to the first position 240A. This provides a non-interfering path for the removal of the removable electronic device 204 from the host electronic device 202. In other words, the thermal interfacing material 238 of the cooling component 208 does not interfere with the movement of the removable electronic device 204, when the removable electronic device 204 is moved out of (withdrawn from) the host electronic device 202. Accordingly, the host electronic device 202 allows a seamless movement of the removable electronic device 204 out of the host electronic device 202 without contacting the thermal interfacing material 238 of the cooling component 208.

Figure 3B:
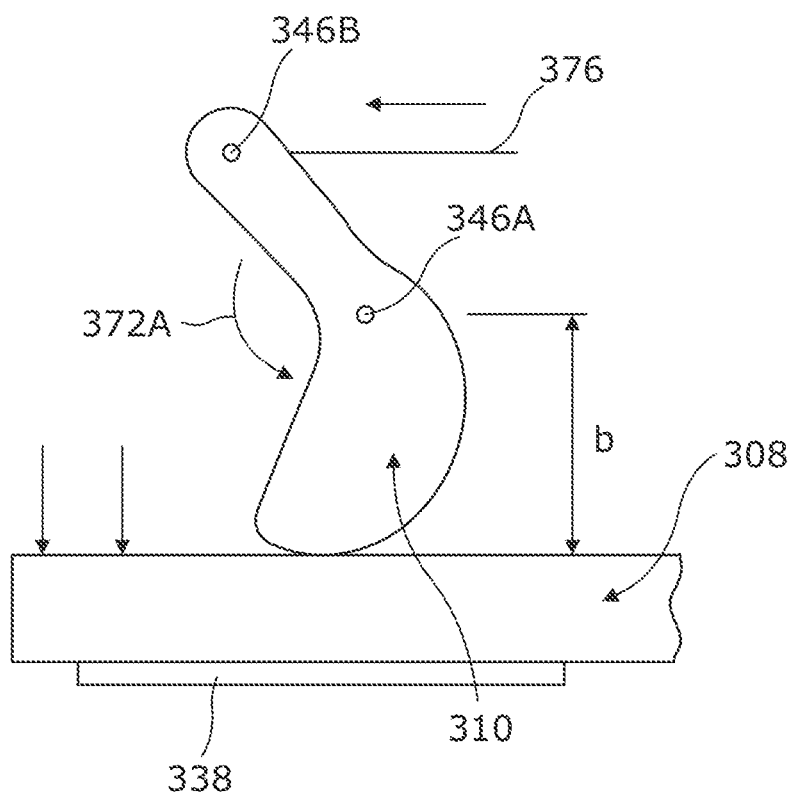
FIG. 3B is a block diagram depicting the side view of the driver and the cooling component of FIG. 3A disposed in a second position according to an example implementation of the present disclosure.

FIG. 3A depicts a side view of a driver 310 and a cooling component 308 disposed in a first position. FIG. 3B depicts the side view of the driver 310 and the cooling component 308 of FIG. 3A disposed in a second position. In some examples, the driver 310 is a cam mechanism.

Referring to FIG. 3A, the driver 310 may have a first connection point 346A movably coupled to a housing or a support structure (as discussed in FIGS. 1B and 2B), and a second connection point 346B connected to an actuator (as discussed in FIGS. 1B and 2B) via a linkage 376. In such examples, the driver 310 is further mounted on the cooling component 308. In one or more examples, the cooling component 308 may be held in the first position by a plurality of biasing members (as discussed in FIGS. 1A and 1B) such that a first radial distance "a" is formed between the first connection point 346A and an upper surface of the cooling component 308. The cooling component 308 in the first position may not interfere with the movement of the removable electronic device into a host electronic device.

Referring to FIG. 3B, the actuator may actuate the driver 310 via the linkage 376 upon contact by a removable electronic device, as discussed in FIGS. 1B and 2B. In other words, the actuator may pull the driver 310 to rotate along a counterclockwise direction 372A relative to the second connection point 346B, upon contact by the removable electronic device. In such examples, the driver 310 may push the cooling component 308 radially downwards to move to the second position, such that a second radial distance "b" is formed between the first connection point 346A and the upper surface of the cooling component 308. The cooling component 308 in the second position may establish a thermal contact between a thermal interfacing material 338 of the cooling component 308 and the removable electronic device. In one or more examples, the second radial distance "b" is greater than the first radial distance "a".

Figure 4B:
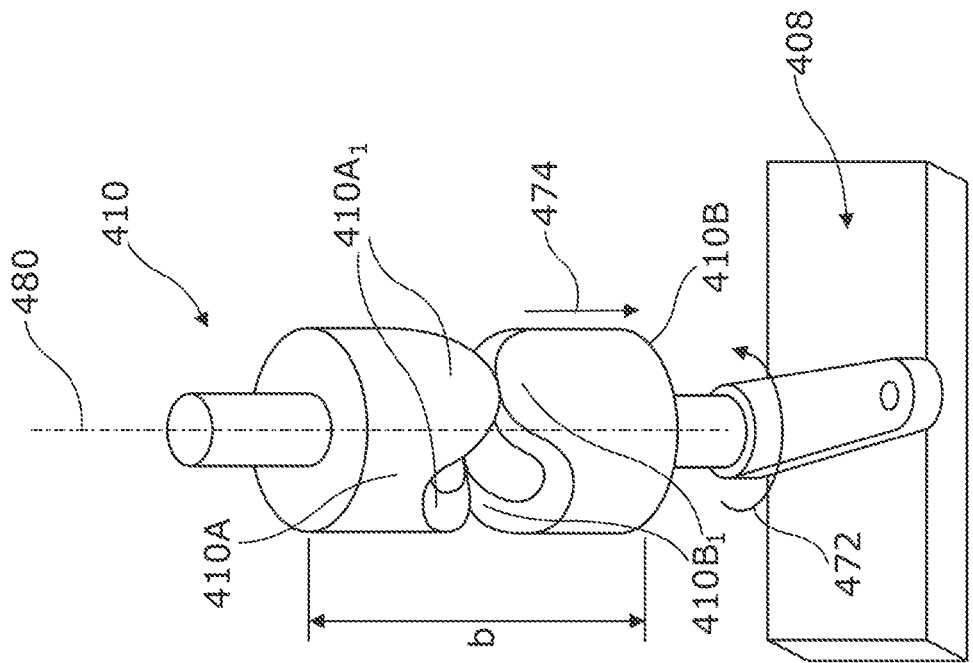
FIG. 4B is a block diagram depicting the side view of other driver and other cooling component of FIG. 4A disposed in a second position according to another example implementation of the present disclosure.
Figure 4A:
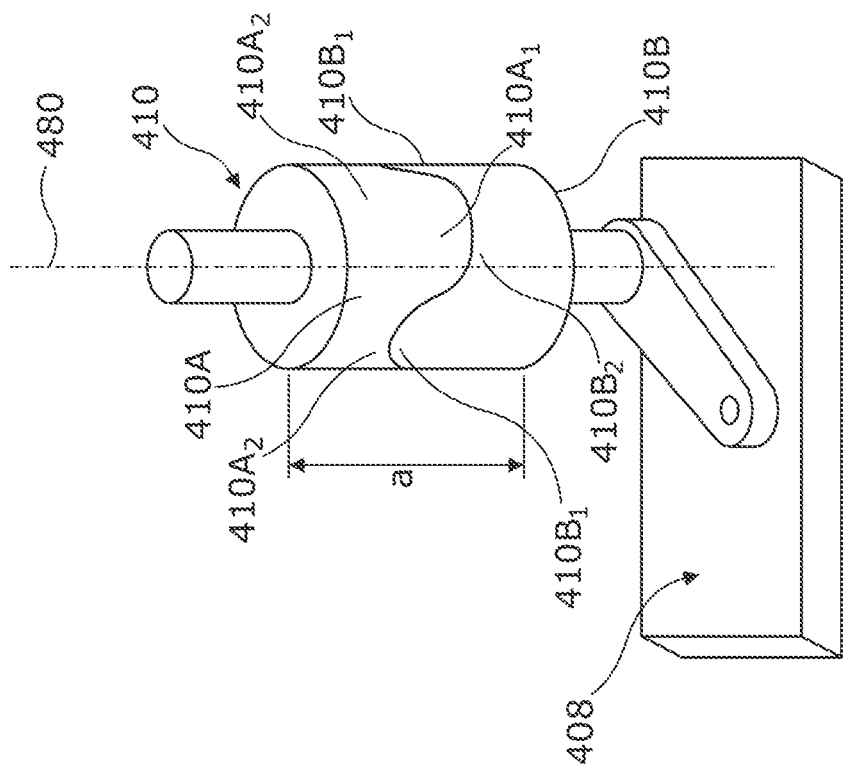
FIG. 4A is a block diagram depicting a side view of another driver and another cooling component disposed in a first position according to another example implementation of the present disclosure.

FIG. 4A depicts a side view of a driver 410 and a cooling component 408 disposed in a first position. FIG. 4B depicts the side view of the driver 410 and the cooling component 408 of FIG. 4A disposed in a second position. In some examples, the driver 410 is a bell crank mechanism.

Referring to FIG. 4A, the driver 410 may have a bell portion 410A and a crank portion 410B, each having complementary profiles to one another. For example, the bell portion 410A has a pair of downwardly extended bell-wall portions 410A$_1$ and a pair of bell-valley portions 410A$_2$, and a crank portion 410B has a pair of upwardly extended crank-wall portions 410B$_1$ and a pair of crank-valley portions 410B$_2$. In such examples, the pair of bell-wall portions 410A$_1$ is seated on the pair of crank-valley portions 410B$_2$ (or the pair of crank-wall portions 410B$_1$ is seated on the pair of bell-valley portions 410A$_2$) such that the driver 410 has a first radial length "a". In some examples, the bell portion 410A may be coupled to a housing or a support structure (as discussed in FIGS. 1B and 2B), and the crank portion 410B may be movably mounted on the cooling component 408. However, in some other examples, the bell portion 410A may be movably connected to the housing or the support structure, and the crank portion 410B may be coupled to the cooling component 408 without deviating from the scope of the present disclosure. The crank portion 410B may be further connected to an actuator (as discussed in FIGS. 1B and 2B) via one or more linkages. In such examples, the cooling component 408 may be held in the first position by a plurality of biasing members (as discussed in FIGS. 1A and 1B). Thus, the cooling component 408 in the first position may not interfere with the movement of the removable electronic device into a host electronic device.

Referring to FIG. 4B, the actuator may actuate the crank portion 410B via the one or more linkages upon contact by a removable electronic device, as discussed in FIGS. 1B and 2B. In other words, the actuator may pull the crank portion 410B, causing the crank portion 410B to rotate along a first direction 472, relative to the rotational axis 480 of the driver 410, upon contact by the removable electronic device. In such examples, the driver 410 may push the cooling component 408 downwards along a radial direction 474 so as to move the cooling component 408 to the second position. In such examples, the pair of bell-wall portions $410A_1$ are seated on the pair of crank-wall portions $410B_1$ such that the driver 410 has a second radial length "b". The cooling component 408 in the second position may establish a thermal contact between a thermal interfacing material 438 in the cooling component 408 and the removable electronic device. In one or more examples, the second radial length "b" is greater than the first radial length "a".

FIG. 5A depicts a perspective view of a portion a computing system 500 having a host electronic device 502 and a removable electronic device 504. In the example of FIG. 5A, the portion of the computing system 500 does not depict a housing (or a support structure), a plurality of biasing members, or a pair of actuators for the purpose of ease of illustration, and such illustration should not be construed as a limitation of the present disclosure. The host electronic device 502 includes a cooling component 508 and a driver 510. The cooling component 508 is substantially similar to the cooling component of FIG. 1A. In one or more examples, the driver 510 is a pin and a guided slot mechanism. For example, the driver 510 includes a plurality of pins 510A and a pair of guided plates 510B, each having a plurality of guided slots 510C. The plurality of pins 510A extend laterally outwards from a corresponding peripheral wall of a pair of peripheral walls 508A of the cooling component 508. Each guided plate 510B includes the plurality of guided slots 510C. In some examples, each guided slot 510C is a linearly tilted slot. The pair of guided plates 510B are disposed spaced apart from one another along a lateral direction and fixed to the housing such that the plurality of pins 510A protrude via the plurality of guided slots 510C.

The removable electronic device 504 may be substantially similar to a removable electronic device 104 of FIGS. 1A-1B, discussed hereinabove. It may be noted herein that one or more components of the removable electronic device 504, such as a heat spreader, a plurality of heat generating components, or the like as shown in FIGS. 1A-1B are not depicted in FIG. 5A for ease of illustration purpose, and such an illustration should not be construed as a limitation of the present disclosure.

FIG. 5B depicts a side view of the computing system 500 of FIG. 5A having the removable electronic device 504 connecting to the host electronic device 502. FIG. 5C depicts the side view of the computing system 500 of FIG. 5A having the removable electronic device 504 connected to the host electronic device 502.

Referring to FIG. 5B, the host electronic device 502 is additionally shown to include a housing 506 and an actuator 514. The actuator 514 is connected (i.e., pivotably connected) to a plurality of drivers 510 via the cooling component 508 and a linkage 574 extending from a first connection point 546A, and movably connected to the housing 506 via a second connection point 546B.

Referring to FIGS. 5B-5C, when an insertion force is applied on the removable electronic device 504, the removable electronic device 504 starts to move inside the slot of the host electronic device 502. The removable electronic device 504, upon contacting the pair of actuators 514, may cause the pair of actuators 514 to swing along a counter-clockwise direction 570A, relative to the second connection point 546B. In such examples, the pair of actuators 514 may actuate the plurality of drivers 510 to push the cooling component 508 from a first position (as shown in FIG. 5B) to a second position (as shown in FIG. 5C). In particular, the plurality of pins 510A slides along the plurality of guided slots 510C to push the cooling component from the first position to the second position. Accordingly, the cooling component 508 in the second position establishes a thermal contact between the thermal interfacing material 538 in the cooling component 508 and the removable electronic device 504. Since the pair of actuators 514 are disposed proximate to the rear panel of the host electronic device 502, the actuator 514 and the cooling component 508 do not interfere with the movement of the removable electronic device 504 into the host electronic device 502, until when the removable electronic device 504 is almost fully inserted into the host electronic device 502 to contact the pair of actuators 514. This allows a seamless movement of the removable electronic device 504 into the host electronic device 502 without contacting the thermal interfacing material 538 of the cooling component 508.

FIG. 6 depicts a portion of a driver 610 of a host electronic device 602. The driver 610 may include a plurality of pins (not shown), and a guided plate 610B having a plurality of guided slots 610C. In some examples, a first guided slot $610C_1$ of the plurality of guided slots 610C is a linearly tilted slot. A second guided slot $610C_2$ of the plurality of guided slots 610C is an inverted "0" shaped tilted slot, and a third guided slot $610C_3$ of the plurality of guided slots 610C is a "0" shaped tilted slot. In one or more examples, the profile of each of the plurality of guided slots 610C may be varied/adjusted to control an engagement of a cooling component with the actuator via a plurality of pins so as to move the cooling component from a first position to a second position for establishing a thermal contact with a removable electronic device.

Figure 7A:
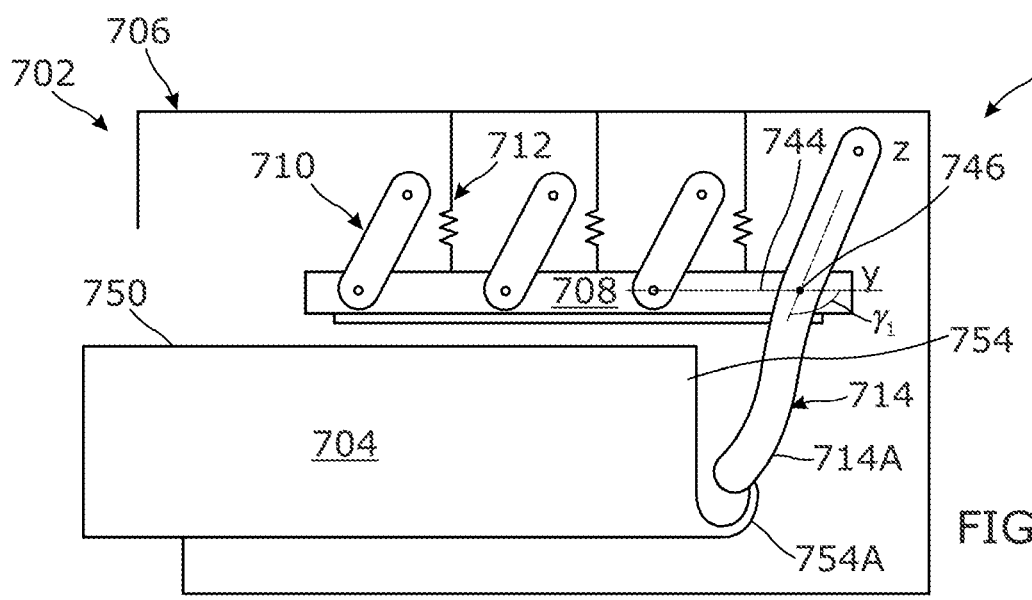
FIG. 7A is a block diagram depicting a side view of a computing system having a removable electronic device connecting to a host electronic device according to yet another example implementation of the present disclosure.
Figure 7B:
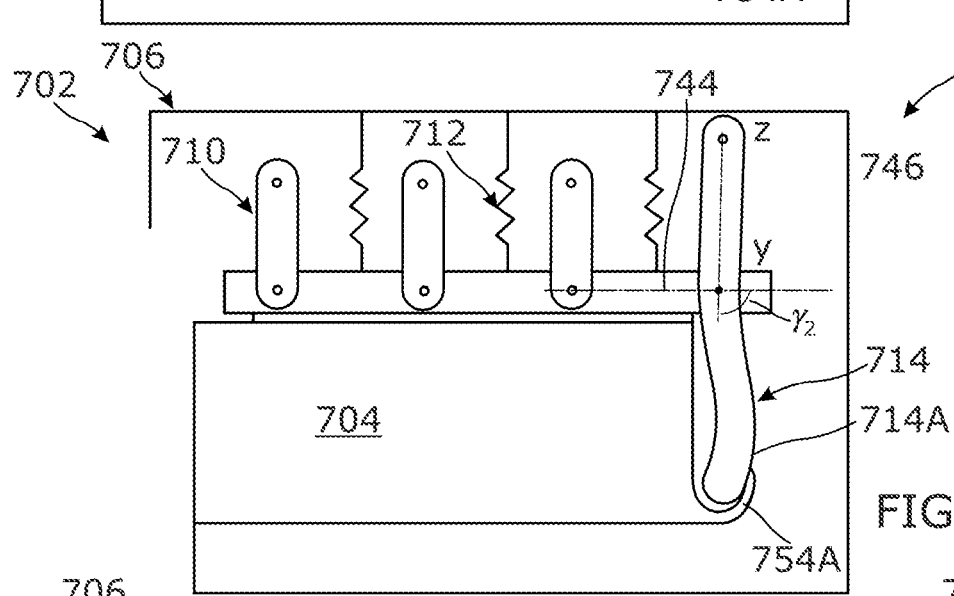
FIG. 7B is a block diagram depicting the side view of the computing system of FIG. 7A having the removable electronic device connected to the host electronic device according to yet another example implementation of the present disclosure.
Figure 7C:
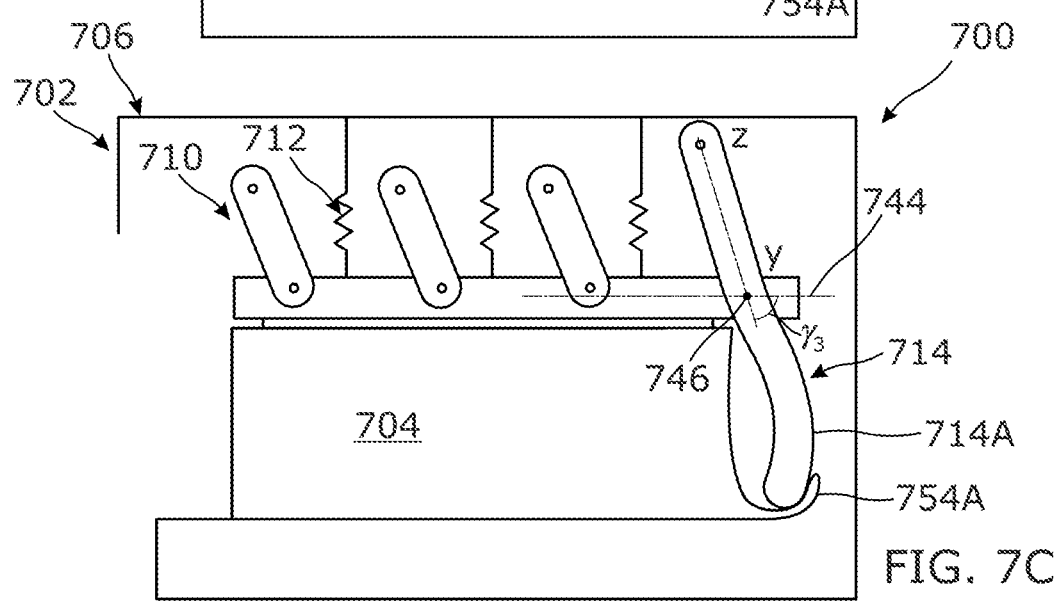
FIG. 7C is a block diagram depicting the side view of the computing system of FIG. 7A having the removable electronic device disconnecting from the host electronic device according to yet another example implementation of the present disclosure.

FIG. 7A depicts a side view of a computing system 700 having a host electronic device 702 and a removable electronic device 704 connecting to the host electronic device 702. FIG. 7B depicts a side view of the computing system 700 of FIG. 7A having the removable electronic device 704 connected to the host electronic device 702. FIG. 7C depicts the side view of the computing system 700 of FIG. 7A having the removable electronic device 704 disconnecting from the host electronic device 702.

In some examples, the computing system 100 is a compute infrastructure having the host electronic device 702, such as a server device, a storage device, a power conversion device, or a networking device, and the removable electronic device 704, such as a data communication device, or a storage drive.

In some examples, the host electronic device 702 is a networking device having a switch, such as an Ethernet switch. The host electronic device 702 includes a housing 706, a cooling component 708, a plurality of drivers 710, a plurality of biasing members 712, and a pair of actuators 714. The host electronic device 702 may further include a fluid conduit and a receptacle (i.e., power and signal connector), as depicted in the example of FIGS. 1A-1B. It may be noted herein that the host electronic device 702 is substantially similar to that of the host electronic device 102 of FIGS. 1A and 1B, other than a profile (design) of each actuator of the pair of actuators 714. For example, each actuator 714 includes a curved free end portion 714A rather than a linear free end portion as depicted in the example of FIG. 1A.

In some examples, the removable electronic device 704 is a data communication device having a transceiver, such as a small form-factor pluggable (SFP) transceiver or a quad small form-factor pluggable (QSFP) transceiver. The removable electronic device 704 may include an electromagnetic induction (EMI) casing 750, a heat generating component, such as a circuit board (not shown) and a plurality of electronic components (not shown), a heat spreader (not shown), and a connector. It may be noted herein that the removable electronic device 704 is substantially similar to that of the removable electronic device 104 of FIGS. 1A and 1B, other than a profile of a front panel 754 of the EMI casing 150. EMI casing 750 may include a hook portion, for example, a curved hook portion 754A, formed at a bottom end portion of the front panel 754.

In one or more examples, the removable electronic device 704 moves inside the host electronic device 702 when an insertion force is applied on the removable electronic device 704. In such examples, the front panel 754 of the removable electronic device 704 faces the pair of actuators 714 (one actuator is shown in FIGS. 7A-7C) of the host electronic device 702. In some examples, when the removable electronic device 704 moves inside the housing 706, the curved hook portion 754A passes through the curved free end portion 714A of each actuator 714 held at an initial position, as shown in FIG. 7A. It may be noted herein that the actuator 714 may be at an angle "$\gamma_1$", which is about −120 degrees relative to a horizontal axis 744 extending along a connection point 746, when the actuator 714 is in the initial position. As the removable electronic device moves further inside the housing 706, a portion of the front panel 754 contacts the curved free end portion 714A and deflects each of the actuators 714 from the initial position to a deflected position. It may be noted herein that the actuator 714 may be at an angle "$\gamma_2$", which is at −90 degrees relative to the horizontal axis 744 extending along the connection point 746, when the actuator 714 is in the deflected position. In such examples, the curved free end portion 714A of each actuator 714 gets engaged with the curved hook portion 754A of the front panel 754, as shown in FIG. 7B. As discussed hereinabove, the actuator 714 in the deflected position actuates the plurality of drivers 710 to move the cooling component 708 from a first position to a second position, and the plurality of biasing members to move from a retracted state to a biased state. Thus, the cooling component 708 moved to the second position may establish a thermal contact with the removable electronic device 704, as shown in FIG. 7B. In some examples, the host electronic device 702 may have a latch mechanism to hold the removable electronic device 704 as soon as the actuator 714 moves to the deflected position. Thus, the latch mechanism may prevent the movement of the removable electronic device 704 in and out of the host electronic device 702. However, in the example of FIGS. 7A-70, the host electronic device 702 may not include the latch mechanism. In such examples, the removable electronic device 704 may further travel inside the host electronic device 702, thereby causing the actuator 714 to over deflect. In other words, the removable electronic device 704 may cause the actuator 714 to move from the deflection position to an over deflected position, as shown in FIG. 7C. It may be noted herein that the actuator 714 may be at an angle "$\gamma_3$", which is about −60 degrees relative to the horizontal axis 744 extending along the connection point 746, when the actuator 714 is in the over deflected position. In such examples, when the removable electronic device 704 is withdrawn from the host electronic device 702, the curved hook portion 754A engaged with the curved free end portion 714A may pull the actuator 714 back to the deflected position from the over deflected position and disengage the curved free end portion 714A from the curved hook portion 754A. The plurality of biasing members 712 may later move to the retracted state, thereby moving back the cooling plate to the first position and cause the plurality the drivers 710 to pull back the pair of actuators 714 to the initial position. If the removable electronic device 704 does not have the curved hook portion 754A engaged with the curved free end portion 714A, then the withdrawal of the removable electronic device 704 from the host electronic device 702 may not initiate the plurality of biasing members 712 to move the actuator 714 back to the deflected position from the over deflected position. This is because the plurality of biasing members 712 may not be able to apply pulling force to move the pair of actuators 714 to swing back along the clockwise direction to move the pair of actuators 714 to the deflected position from the over deflection position, as the pair of actuators 714 may only swing back along the counterclockwise direction from the over deflected position.

Figure 8A:
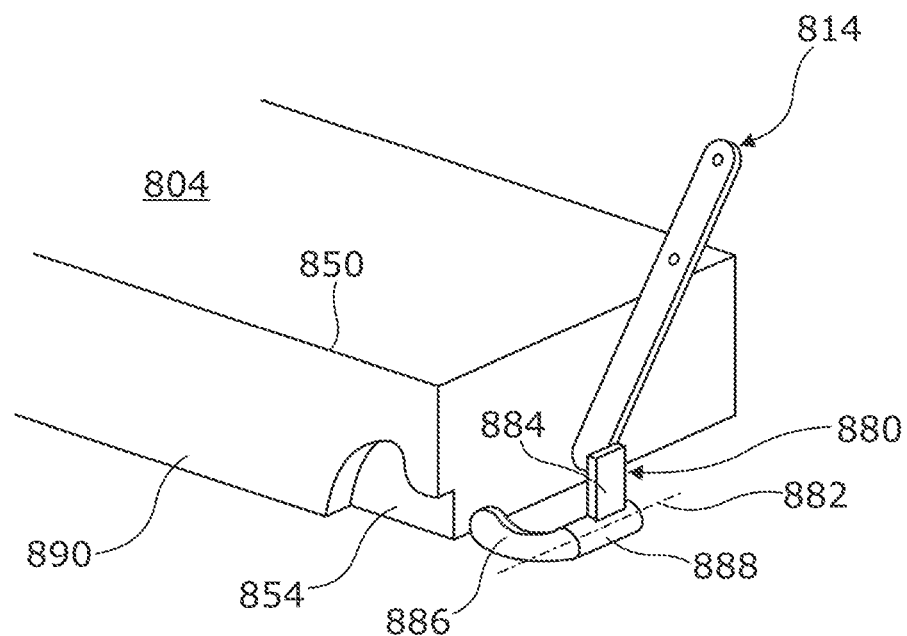
FIG. 8A illustrates a perspective view of a removable electronic device and a retraction mechanism in contact with an actuator of a computing device according to an example implementation of the present disclosure.
Figure 8B:
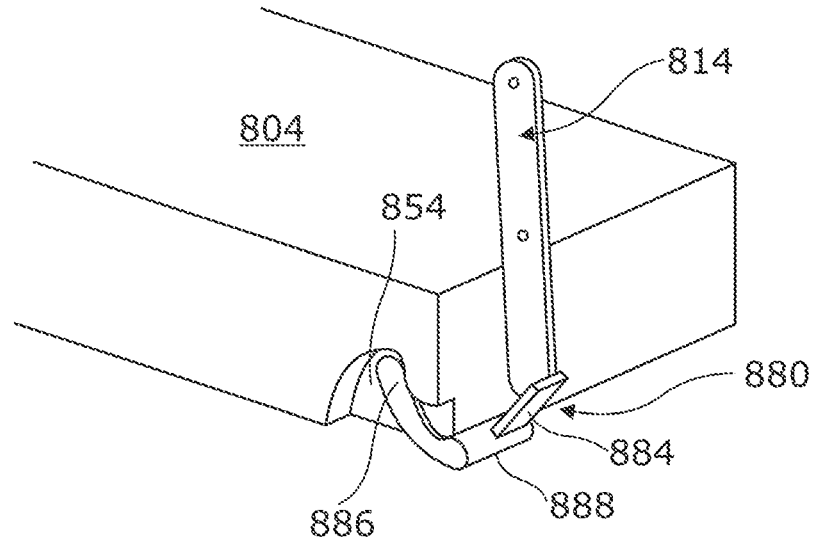
FIG. 8B illustrates a perspective view of the removable electronic device of FIG. 8A engaged with the retraction mechanism and the actuator of the computing device according to an example implementation of the present disclosure.

FIG. 8A depicts a perspective view of a retraction mechanism 880 of a host electronic device, disengaged with a removable electronic device 804. FIG. 8B depicts a perspective view of the retraction mechanism 880 of FIG. 8A engaged with the removable electronic device 804.

In some examples, the retraction mechanism 880 may be disposed at a rear panel of a housing in the host electronic device. For example, the retraction mechanism 880, such as a bell crank may be connected to a pair of peripheral walls of the housing. In some examples, the retraction mechanism 880 has a first lever 884, and a second lever 886 disposed at a right angle relative to the first lever 884 and coupled to the first lever 884 via a connecting lever 888. In such examples, the retraction mechanism 880 may be able to rotate along a lateral axis 882 extending along the connecting lever 888. Further, the retraction mechanism 880 is disposed within the housing such that the first lever 884 is in contact with a free end of the actuator 814. In some examples, the removable electronic device 804 has a hook portion 854 formed at an end portion of a peripheral wall 890 in an EMI casing 850.

Referring to FIG. 8B, the actuator 814, upon contact by the removable electronic device 804, moves to a deflected position and/or to an over deflection position, as discussed in the example of FIGS. 7A-7C. In such examples, when the actuator 814 deflects to the over deflected position, the second lever 886 of the retraction mechanism 880 gets engaged with the removable electronic device 804, for example, with the hook portion 854. Thus, when the removable electronic device 804 is withdrawal from the host electronic device, the hook portion 854 causes the retraction mechanism 880, for example, the second lever 886 to pull the actuator 814 back to the deflected position and disengage the second lever 886 from the removable electronic device 804.

Figure 9:
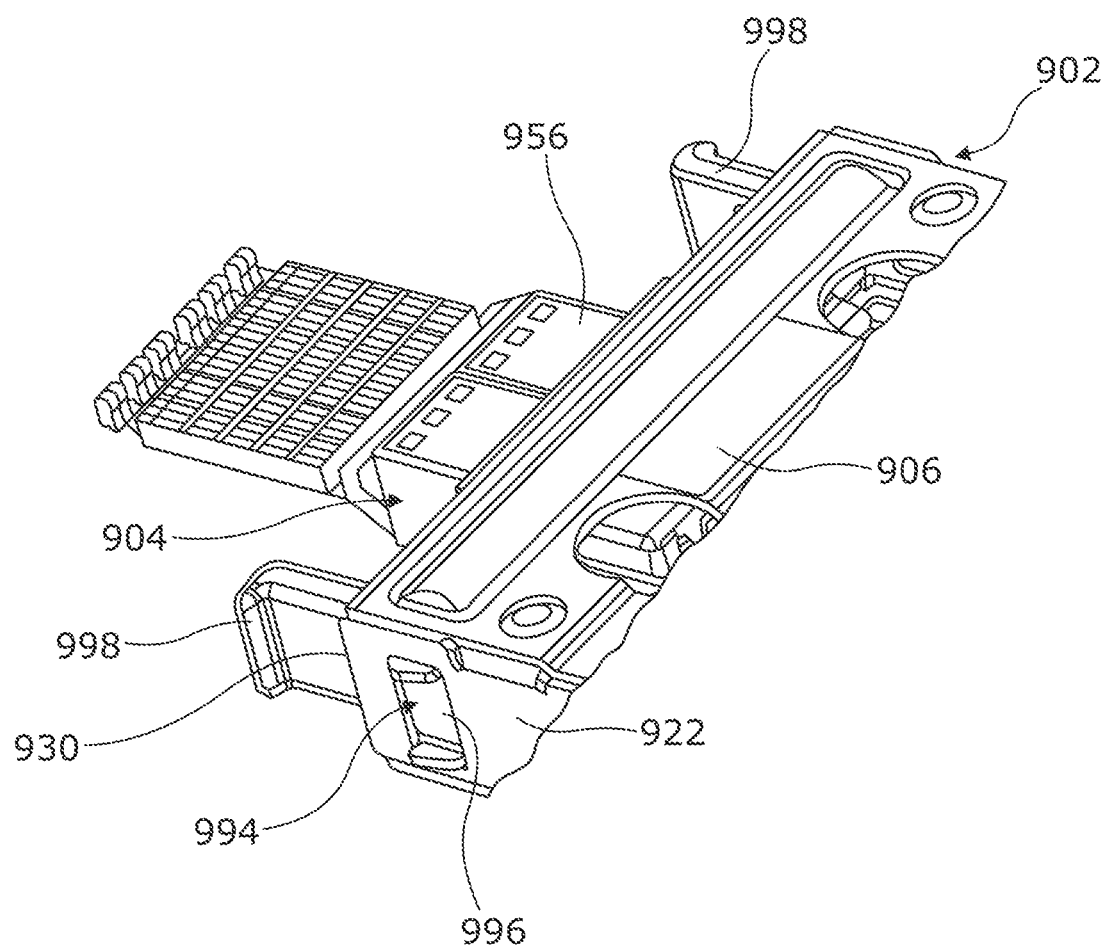
FIG. 9 illustrates a perspective view of a latch mechanism for detachably connecting a removable electronic device to a host electronic device according to an example implementation of the present disclosure.

FIG. 9 depicts a perspective view of a portion of host electronic device 902 and a removable electronic device 904, and a latch mechanism 994 detachably connecting the removable electronic device 904 to the host electronic device 902. In some examples, the latch mechanism 994 is formed by a combination of a pair of holes 996 formed at an entrance 930 of a housing 906 of the host electronic device 902, and a pair of flexible arms 998 formed at a rear panel 956 of the removable electronic device 904. For example, the pair of holes 996 are formed on each peripheral wall of a pair of peripheral walls 922 in the housing 906.

In such examples, when the removable electronic device 904 is connected to the host electronic device 902, the pair of flexible arms 998 of the latch mechanism 994 may engage within the pair of holes 996 so as to detachably connect and hold the removable electronic device 904 within a slot of the housing 906. In some examples, the removable electronic device 904 may be construed to be connected to the host electronic device 902, when a connector of the removable electronic device 904 is engaged with a receptacle of the host electronic device 902 or when an actuator of the host electronic device 902 is deflected to a deflected position, and a cooling component of the host electronic device 902 is moved to a second position to establish a thermal contact with the removable electronic device 904. In one or more examples, each of the pair of flexible arms 998 may be bent inwards to disengage the corresponding flexible arm 998 from the pair of holes 996, when the removable electronic device 904 has to be withdrawn from the host electronic device 902.

Various features as illustrated in the examples described herein may be implemented in a system, such as a host electronic device and method of establishing a thermal contact with a removable electronic device by a cooling component of the host electronic device when the removable electronic device is connected to the host electronic device. In one or more examples, a thermal interfacing material may not interfere (or interrupt) with a movement of the removable electronic device into and/or from the host electronic device, thereby preventing the possible damage to the thermal interfacing material by the movement of the removable electronic device into the host electronic device. Further, the removable electronic device may be easily connected into and disconnected from the host electronic device, since the cooling component does not interfere with the movement of the removable electronic device, thereby preventing repetitive force (e.g., insertion force or removal force) related damage. Further, the lip wall of the housing disposed at an inlet opening in the housing may cover the thermal interfacing material of the cooling component in the retracted position from the external environment, thereby preventing the possible damage to the thermal interfacing material from the foreign objects.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A host electronic device comprising:
   a support structure;
   a cooling component movably connected to the support structure;
   a driver movably connected to the support structure;
   an actuator movably connected to the support structure and the driver, wherein the actuator, upon contact by a removable electronic device, causes a movement of the cooling component via the driver, for establishing a thermal contact between the cooling component and the removable electronic device; and
   a retraction mechanism disposed in contact with the actuator, wherein the actuator, upon contact by the removable electronic device, moves to a deflected position and causes the retraction mechanism to engage with the removable electronic device, and wherein the removable electronic device, upon withdrawal from the host electronic device, causes the retraction mechanism to pull back the actuator to an initial position and disengage from the removable electronic device.

2. The host electronic device of claim 1, further comprising a biasing member coupled to the support structure, wherein the cooling component is movably connected to the support structure via the biasing member, and wherein the actuator, upon contact by the removable electronic device, causes the biasing member to move from a retracted state to a biased state via the driver.

3. The host electronic device of claim 1, wherein the driver is at least one of a lever mechanism, a cam mechanism, a bell crank mechanism, or a pin and a guided slot mechanism.

4. The host electronic device of claim 1, further comprising a latch mechanism for detachably connecting the removable electronic device when disposed within and connected to the host electronic device.

5. The host electronic device of claim 1, further comprising a thermal interfacing material coupled to the cooling component, and wherein the cooling component establishes the thermal contact with a heat generating component of the removable electronic device via the thermal interfacing material.

6. The host electronic device of claim 1, further comprising a receptacle disposed at an outlet, facing an inlet of the host electronic device, and wherein the receptacle receives a connector of the removable electronic device upon the movement of the removable electronic device into the host electronic device.

7. A host electronic device comprising:
   a support structure;
   a cooling component movably connected to the support structure;
   a driver movably connected to the support structure;
   an actuator movably connected to the support structure and the driver, wherein the actuator, upon contact by a removable electronic device, causes a movement of the cooling component via the driver, for establishing a thermal contact between the cooling component and the removable electronic device, wherein the actuator comprises a curved free end portion, wherein the actuator, upon contact by the removable electronic device, moves to a deflected position and causes the curved free end portion to engage with a hook portion of the removable electronic device, and wherein the removable electronic device, upon withdrawal from the host electronic device, causes the actuator to pull back to an initial position and disengage the curved free end portion from the hook portion.

8. The host electronic device of claim 7, wherein the driver is at least one of a lever mechanism, a cam mechanism, a bell crank mechanism, or a pin and a guided slot mechanism.

9. The host electronic device of claim 7, further comprising a latch mechanism for detachably connecting the removable electronic device when disposed within the slot of the housing and connected to the host electronic device.

10. The host electronic device of claim 7, further comprising a thermal interfacing material coupled to the cooling component, and wherein the cooling component establishes the thermal contact with a heat generating component of the removable electronic device via the thermal interfacing material.

11. The host electronic device of claim 7, further comprising a receptacle disposed at an outlet, facing an inlet of the host electronic device, and wherein the receptacle receives a connector of the removable electronic device upon a movement of the removable electronic device into the host electronic device.

12. The host electronic device of claim 7, further comprising a biasing member coupled to the support structure, wherein the cooling component is movably connected to the support structure via the biasing member, wherein the biasing member, when in a retracted state, holds the cooling component in a first position and the actuator in the initial position via the driver, and wherein the actuator, upon contact by the removable electronic device, is swingable from the initial position to the deflected position, to actuate the driver to push the biasing member to a biased state and the cooling component to a second position for establishing the thermal contact between the cooling component and the removable electronic device.

13. A computing system comprising:
a host electronic device comprising a support structure, a cooling component movably connected to the support structure, a driver movably connected to the support structure, an actuator movably connected to the support structure and the driver, and a retraction mechanism disposed in contact with the actuator; and
a removable electronic device comprising a heat generating component, wherein the removable electronic device is detachably connectable to the host electronic device,
wherein the actuator, upon contact by the removable electronic device, causes a movement of the cooling component via the driver, for establishing a thermal contact between the cooling component and the heat generating component,
wherein the actuator, upon contact by the removable electronic device, moves to a deflected position and causes the retraction mechanism to engage with the removable electronic device, and
wherein the removable electronic device, upon withdrawal from the host electronic device, causes the retraction mechanism to pull back the actuator to an initial position and disengage from the removable electronic device.

14. The computing system of claim 13, further comprising a biasing member coupled to the support structure, wherein the cooling component is movably connected to the support structure via the biasing member, and wherein the actuator, upon contact by the removable electronic device, causes the biasing member to move from a retracted state to a biased state via the driver.

15. The computing system of claim 13, wherein the driver is at least one of a lever mechanism, a cam mechanism, a bell crank mechanism, or a pin and a guided slot mechanism.

16. The computing system of claim 13, further comprising a latch mechanism for detachably connecting the removable electronic device when disposed within and connected to the host electronic device.

17. The computing system of claim 13, further comprising a thermal interfacing material coupled to the cooling component, and wherein the cooling component establishes the thermal contact with a heat generating component of the removable electronic device via the thermal interfacing material.

18. The computing system of claim 13, further comprising a receptacle disposed at an outlet, facing an inlet of the host electronic device, and wherein the receptacle receives a connector of the removable electronic device upon the movement of the removable electronic device into the host electronic device.

* * * * *